(12) United States Patent
Nicewicz et al.

(10) Patent No.: US 11,678,451 B2
(45) Date of Patent: Jun. 13, 2023

(54) DATA CENTER CABINET

(71) Applicant: Panduit Corp., Tinley Park, IL (US)

(72) Inventors: Andrzej Nicewicz, Westchester, IL (US); Jerry A. Wiltjer, Frankfort, IL (US); Tomasz K. Waz, Orland Park, IL (US); James N. Fleming, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 117 days.

(21) Appl. No.: 17/243,882

(22) Filed: Apr. 29, 2021

(65) Prior Publication Data

US 2021/0345501 A1    Nov. 4, 2021

Related U.S. Application Data

(60) Provisional application No. 63/019,561, filed on May 4, 2020.

(51) Int. Cl.
*H05K 5/00* (2006.01)
*H05K 5/02* (2006.01)
*H05K 7/18* (2006.01)

(52) U.S. Cl.
CPC ........... *H05K 5/023* (2013.01); *H05K 5/0008* (2013.01); *H05K 7/183* (2013.01)

(58) Field of Classification Search
CPC ...... H05K 5/023; H05K 5/0008; H05K 5/027; H05K 7/183; H05K 7/1488; H05K 7/18;
(Continued)

(56) References Cited

U.S. PATENT DOCUMENTS

| 32,482 A | 6/1861 | Lane |
|---|---|---|
| 2,963,734 A | 12/1960 | Huget |

(Continued)

FOREIGN PATENT DOCUMENTS

| WO | 2010016022 A1 | 2/2010 |
|---|---|---|
| WO | 2011156006 | * 12/2011 |

OTHER PUBLICATIONS

Chatsworth Products Inc.'s Slimframe™ C-Series Cabinet System product brochure; 2001 (6 pgs.).
(Continued)

*Primary Examiner* — Janet M Wilkens
(74) *Attorney, Agent, or Firm* — Christopher S. Clancy; James H. Williams; Aimee E. McVady

(57) ABSTRACT

A data center cabinet has an equipment rail movably secured to front-to-back beams by a retaining mechanism. The retaining mechanism has a threaded member extending through a front-to-back beam and the equipment rail and a handle rotatable relative to the threaded member. A first cam disk is positioned between the handle and equipment rail and is fixed to the equipment rail and a second cam disk is positioned between the handle and first cam disk and is fixed to the handle. First and second surfaces of the first and second cam disks are engaged with the handle in a first position to provide a clamping force between the equipment rail and front-to-back beam to prevent movement of the equipment rail and the first and second cam surfaces are disengaged with the handle in a second position to remove the clamping force to allow movement of the equipment rail.

23 Claims, 16 Drawing Sheets

(58) Field of Classification Search
CPC .... H05K 7/1401; H05K 7/1489; A47B 96/06; A47B 96/14; A47B 96/1441; A47B 57/54; A47B 47/0083; F16B 2/18; F16B 2/185
USPC ............ 312/244, 265.1–265.4, 223.1, 223.2; 411/535, 536; 211/26.1, 26; 174/50
See application file for complete search history.

(56) References Cited

U.S. PATENT DOCUMENTS

| | | | |
|---|---|---|---|
| 5,542,549 A * | 8/1996 | Siemon | H04Q 1/14 361/829 |
| 5,571,256 A * | 11/1996 | Good | H02B 1/36 211/151 |
| 5,585,599 A | 12/1996 | Schwenke et al. | |
| 5,639,150 A | 6/1997 | Anderson et al. | |
| 5,938,302 A | 8/1999 | Anderson et al. | |
| 5,997,117 A | 12/1999 | Krietzman | |
| 6,036,290 A | 3/2000 | Jancsek et al. | |
| 6,145,943 A * | 11/2000 | Reuter | H02B 1/32 312/265.6 |
| 6,238,027 B1 | 5/2001 | Köhler et al. | |
| 6,478,166 B2 * | 11/2002 | Hung | H05K 7/183 211/175 |
| 6,659,513 B1 * | 12/2003 | Ramsauer | E05C 5/00 292/64 |
| 7,293,666 B2 | 11/2007 | Bergesch et al. | |
| 7,472,970 B2 * | 1/2009 | Bergesch | G06F 1/183 312/223.1 |
| 7,974,105 B2 | 7/2011 | Dean, Jr. et al. | |
| 8,033,406 B2 | 10/2011 | Mattlin et al. | |
| 8,210,490 B2 | 7/2012 | Mattlin et al. | |
| 8,353,492 B2 | 1/2013 | Mattlin et al. | |
| 8,411,465 B2 | 4/2013 | Dean, Jr. et al. | |
| 8,437,147 B2 | 5/2013 | Dean, Jr. et al. | |
| 8,528,872 B2 | 9/2013 | Mattlin et al. | |
| 8,787,023 B2 | 7/2014 | Lewis, II et al. | |
| 8,901,418 B2 * | 12/2014 | Walker | H05K 7/1491 211/26 |
| 8,901,438 B2 | 12/2014 | Lewis, II et al. | |
| 8,955,927 B2 | 2/2015 | Fritz et al. | |
| 9,055,677 B2 | 6/2015 | Garza et al. | |
| 9,408,326 B2 | 8/2016 | Lewis, II et al. | |
| 9,642,270 B2 | 5/2017 | Lewis, II et al. | |
| 9,781,852 B2 | 10/2017 | Garza et al. | |
| 9,814,159 B2 | 11/2017 | Lewis, II et al. | |
| 9,980,400 B2 | 5/2018 | Lewis, II et al. | |
| 10,178,784 B2 | 1/2019 | Lewis, II et al. | |
| 10,182,651 B2 | 1/2019 | Jost et al. | |
| 10,237,994 B2 | 3/2019 | Donowho et al. | |
| 10,357,104 B2 | 7/2019 | Jost et al. | |
| 10,448,534 B2 | 10/2019 | Jost et al. | |
| 10,492,605 B2 | 12/2019 | Jost et al. | |
| 10,561,038 B2 | 2/2020 | Jost et al. | |
| 10,588,235 B2 | 3/2020 | Jost et al. | |
| 2002/0195408 A1 * | 12/2002 | Hegrenes | H05K 7/183 312/265.4 |
| 2003/0075476 A1 | 4/2003 | Savoie | |
| 2006/0102575 A1 | 5/2006 | Mattlin et al. | |
| 2012/0018389 A1 | 1/2012 | Fan | |
| 2013/0229096 A1 * | 9/2013 | Wright | H04Q 1/09 312/223.2 |
| 2013/0249363 A1 | 9/2013 | Liu | |
| 2017/0215587 A1 * | 8/2017 | Jost | H05K 7/1488 |
| 2017/0217465 A1 * | 8/2017 | Jost | H05K 7/1488 |
| 2017/0223864 A1 | 8/2017 | Jost et al. | |
| 2019/0215973 A1 | 7/2019 | Donowho et al. | |
| 2020/0077533 A1 | 3/2020 | Lu et al. | |

OTHER PUBLICATIONS

Elesa & Ganter's Clamping Levers with Eccentrical Cam Part No. GN 927.3; catalog pages; Aug. 2018; (2 pgs.).

JW Winco®'s Clamping Levers with Eccentrial Cam Part No. GN 927-101-M8-20-B; standard sheet; https://www.jwwinco.com/en-us/products/quick-finder/GN-927.3-Steel-Clamping-Levers-with-Eccentrical-Cam-Tapped-Type?q=GN %20927.3; printed Apr. 26, 2021 (2 pgs.).

Kipp's Cam Levers with External Thread by Kipp Part No. K0005.2501108X25 datasheet https://www.kippusa.com/us/en/Products/Adjustable-Handles/Cam-Levers/K0005-Cam-Leverswith-internal-and-external-thread/K0005-AG-Metric-Cam-Levers-with-external-thread-metric.html?search_keywords=K0005.2501108X25; printed Apr. 26, 2021; (3 pgs.).

* cited by examiner

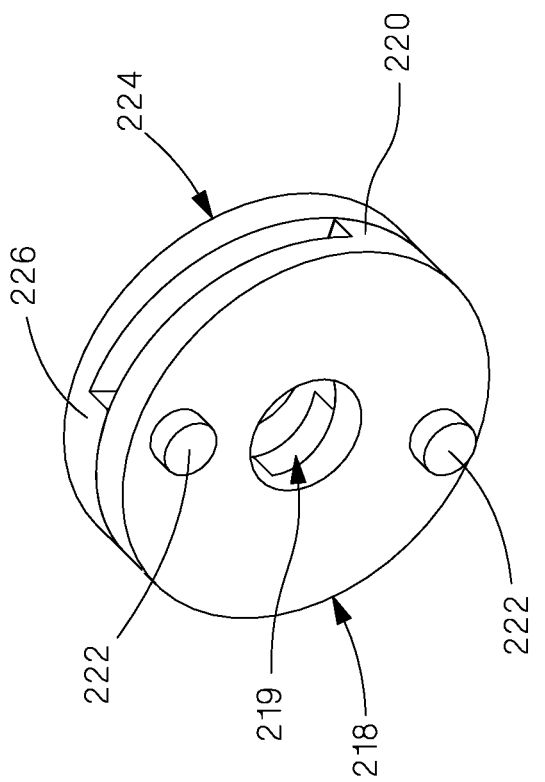
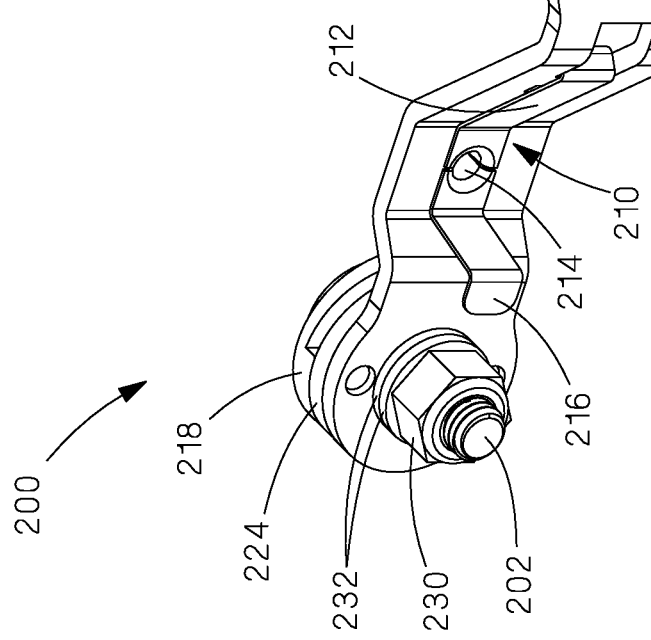
FIG. 10
FIG. 9

DATA CENTER CABINET

CROSS REFERENCE TO RELATED APPLICATION(S)

This application claims benefit to U.S. Provisional Patent Application No. 63/019,561, filed on May 4, 2020, the entirety of which is hereby incorporated by reference herein.

FIELD OF THE INVENTION

The present invention generally relates to data center cabinets, and, more specifically, to the mounting of equipment rails in data center cabinets.

BACKGROUND

Typical data center cabinets are required to meet various standards, such as Electronic Industries Alliance (EIA) telecommunications standards. For example, the EIA/ECA-310-E standard requires that certain lateral dimensions are required within data center cabinets to allow for the installation and removal of standard rack mounted equipment. Specifically, this standard requires that the lateral space between equipment rails in the data center cabinet must be a minimum of 450 millimeters, while the distance between the cage nut hole centers in the equipment rails must be 465+/−1.6 millimeters. While the distance between equipment rails in data center cabinets can typically be fairly tightly controlled at the top and bottom of the data center cabinet, due to a large range of required tolerances for metal parts within the cabinet and the possibility of the vertical posts bowing or curving throughout the height of the data center cabinet, it can be difficult to control the lateral distance between the equipment rails in the middle of the data center cabinet.

In addition, due to the variety of electronic equipment that can be installed in data center cabinets, the equipment rails are typically adjustable in the front to back direction to allow for the installation of electronic equipment of different sizes. However, the adjustment of standard equipment rails in data center cabinets requires tools and takes significant time. Therefore, it would be beneficial to be able to adjust the position of the equipment rails within a data center cabinet without tools to minimize the time and effort required to adapt the position of the equipment rails.

SUMMARY

In one example, a data center cabinet comprises a first plurality of front-to-back beams, a second plurality of front-to-back beams, and an equipment rail movably secured to each of the first plurality of front-to-back beams by a retaining mechanism. The retaining mechanism comprises a threaded member extending through an elongated slot in one of the first plurality of front-to-back beams and an aperture in the equipment rail. A handle is positioned on the threaded member and is rotatable relative to the threaded member. A first cam disk having a first cam surface is positioned on the threaded member between the handle and the equipment rail and fixed to the equipment rail and a second cam disk having a second cam surface is positioned on the threaded member between the handle and the first cam disk and fixed to the handle such that the second cam disk is rotatable with the handle. A lock nut is threaded on the threaded member to secure the handle, the first cam disk, and the second cam disk on the threaded member. The handle is rotatable between a first position and a second position, where the first cam surface and the second cam surface are engaged in the first position to provide a clamping force between the equipment rail and the one of the first plurality of front-to-back beams to prevent movement of the equipment rail and the first cam surface and the second cam surface are disengaged in the second position to remove the clamping force to allow movement of the equipment rail.

In another example, a data center cabinet comprises a front picture frame assembly including a pair of front vertical posts, a first top side-to-side beam secured to the pair of front vertical posts, and a first bottom side-to-side beam secured to the pair of front vertical posts and a rear picture frame assembly including a pair of rear vertical posts, a second top side-to-side beam secured to the pair of rear vertical posts, and a second bottom side-to-side beam secured to the pair of rear vertical posts. A pair of top front-to-back beams are secured to the front picture frame assembly and the rear picture frame assembly, a pair of bottom front-to-back beams secured to the front picture frame assembly and the rear picture frame assembly, and a pair of middle front-to-back beams secured to the front picture frame assembly and the rear picture frame assembly such that the pair of middle front-to-back beams are adjustable laterally such that a distance between the pair of middle front-to-back beams can be adjusted.

In another example, a method of assembling a base frame of a data center cabinet, comprising the steps of: securing a first top side-to-side beam and a first bottom side-to-side beam between a pair of front vertical posts to form a front picture frame assembly; securing a second top side-to-side beam and a second bottom side-to-side beam between a pair of rear vertical posts to form a rear picture frame assembly; securing a pair of top front-to-back beams and a pair of bottom front-to-back beams between the front picture frame assembly and the rear picture frame assembly; aligning a pair of middle front-to-back beams between the front picture frame assembly and the rear picture frame assembly; securing a pair of equipment rails to the top front-to-back beams, the middle front-to-back beams, and the bottom front-to-back beams; adjusting a lateral distance between the pair of equipment rails; and securing the middle front-to-back beams to the front picture frame assembly and the rear picture frame assembly.

In another example, a data center cabinet comprises a front-to-back beam and an equipment rail positioned adjacent and movably secured to the front-to-back beam by a retaining mechanism. The retaining mechanism comprises a cam lever assembly including a bushing, a threaded member extending through an aperture in the bushing and through an elongated slot in the front-to-back beam, and a handle attached to the threaded member. The handle is rotatable relative to the threaded member and the bushing includes a plurality of protrusions extending from an inner surface of the bushing and received in a plurality of apertures in the equipment rail to prevent movement of the bushing relative to the equipment rail. A slider is positioned on the threaded member on an opposite side of the front-to-back beam from the cam lever assembly and a lock nut is threaded on the threaded member adjacent the slider. The handle is rotatable between a clamped position, in which a clamping force is exerted between the equipment rail and the front-to-back beam to prevent movement of the equipment rail, and an unclamped position, in which the clamping force is removed to allow movement of the equipment rail.

BRIEF DESCRIPTION OF THE DRAWINGS

Certain examples of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular examples illustrated herein.

FIG. 9 is a front perspective view of the first example retaining mechanism of FIG. 8;

FIG. 10 is a rear perspective view of the first and second cam disks of the first example retaining mechanism of FIG. 9 with the cam surfaces engaged;

DETAILED DESCRIPTION

Figure 1:
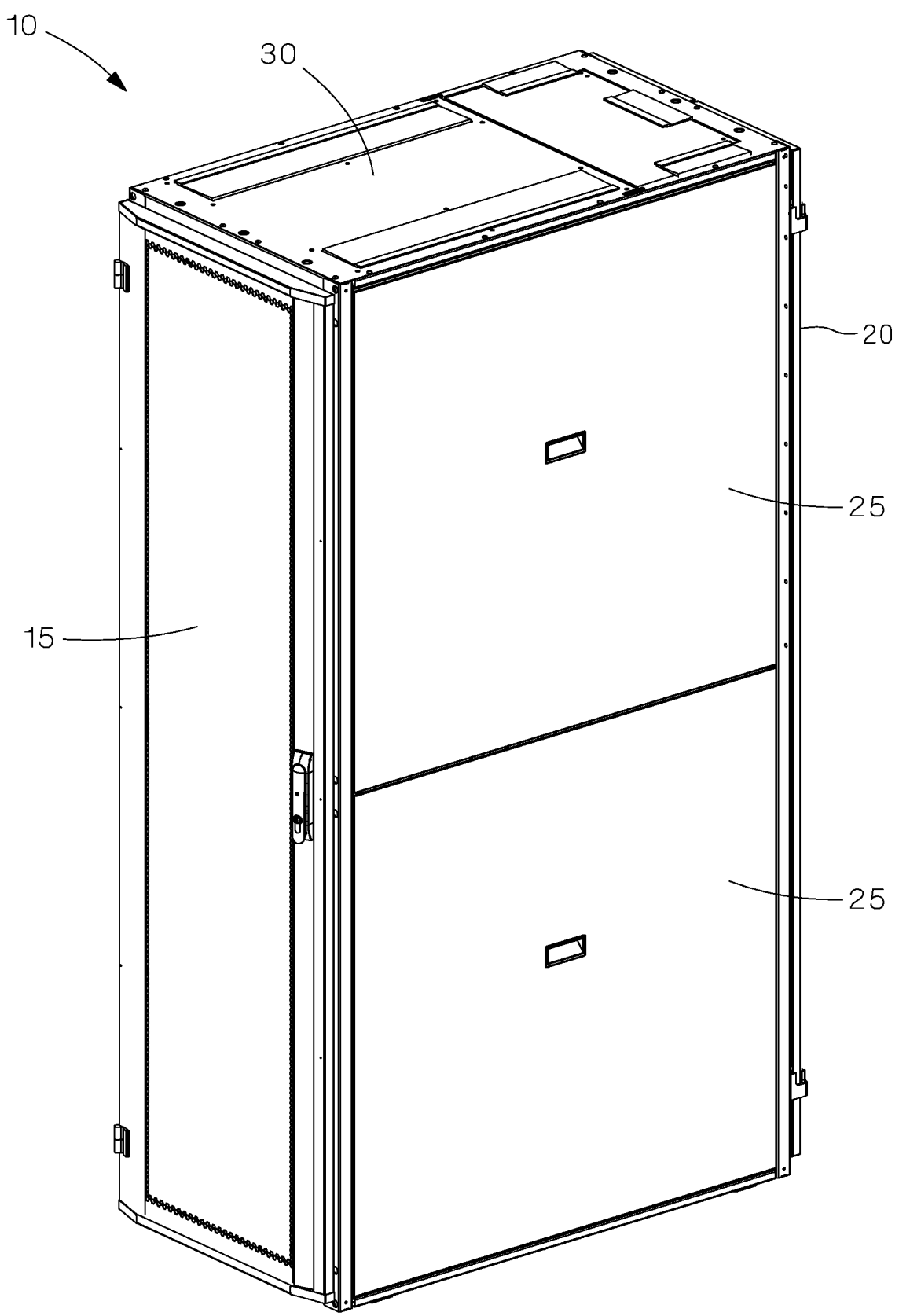
FIG. 1 is a front-right perspective view of an example data center cabinet.

The examples shown and described herein provide a data center cabinet having equipment rails that attach to the front-to-back beams of the base frame with a retaining mechanism that allows for quick and tool-less movement and repositioning of the equipment rails along the front-to-back beams. The tool-less retaining mechanism enables a user to reposition the equipment rails by hand and minimizes the time and effort required to adjust the position of the equipment rails in a data center cabinet when initially received or when different electronic equipment is being used in a particular data center cabinet.

In addition, the examples herein allow for the horizontal/lateral adjustment of the position of the middle front-to-back beam if the base frame, and therefore the positioning and spacing of the equipment rails, which ensures that the spacing of the equipment rails is consistent from top to bottom and can meet the applicable EIA standards.

Referring to FIG. 1-4, an example data center cabinet 10 is shown that generally includes a base frame 100 and a front door 15, back door 20, side panels 25, and top cap 30 mounted or attached to base frame 100. Front door 15 can be a single door, as shown, that is hinged on one or both sides with one or more handles, can be a double door that is hinged on the sides and opens in the middle, can be solid or perforated, or can have any other features desired for a particular application. Similarly, back door 20 can be a double door, as shown, that is hinged on the sides and opens in the middle, can be a single door as described above, can be solid or perforated, or can have any other features desired for a particular application. Side panels 25 one each side of data center cabinet 10 can be a single panel or multiple panels, as shown, can be removably secured to base frame 100, can be solid or perforated, and can have any other features desired for a particular application. Top cap 30 can also be a single panel or multiple panels, can be solid or perforated, can have various openings, and can have any other features desired for a particular application.

Figure 2:
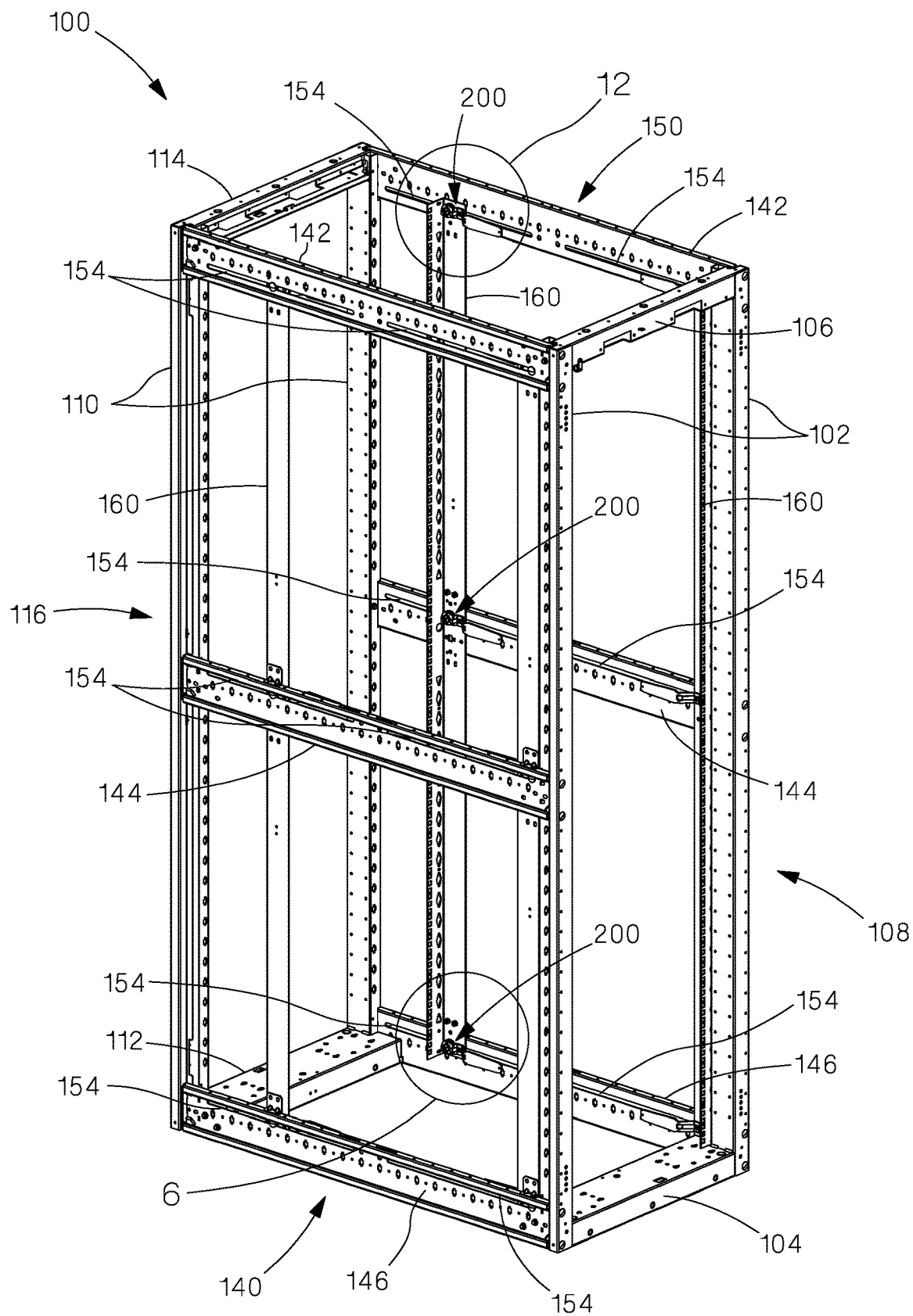
FIG. 2 is a front-left perspective view of an example base frame of the data center cabinet of FIG. 1.
Figure 3:
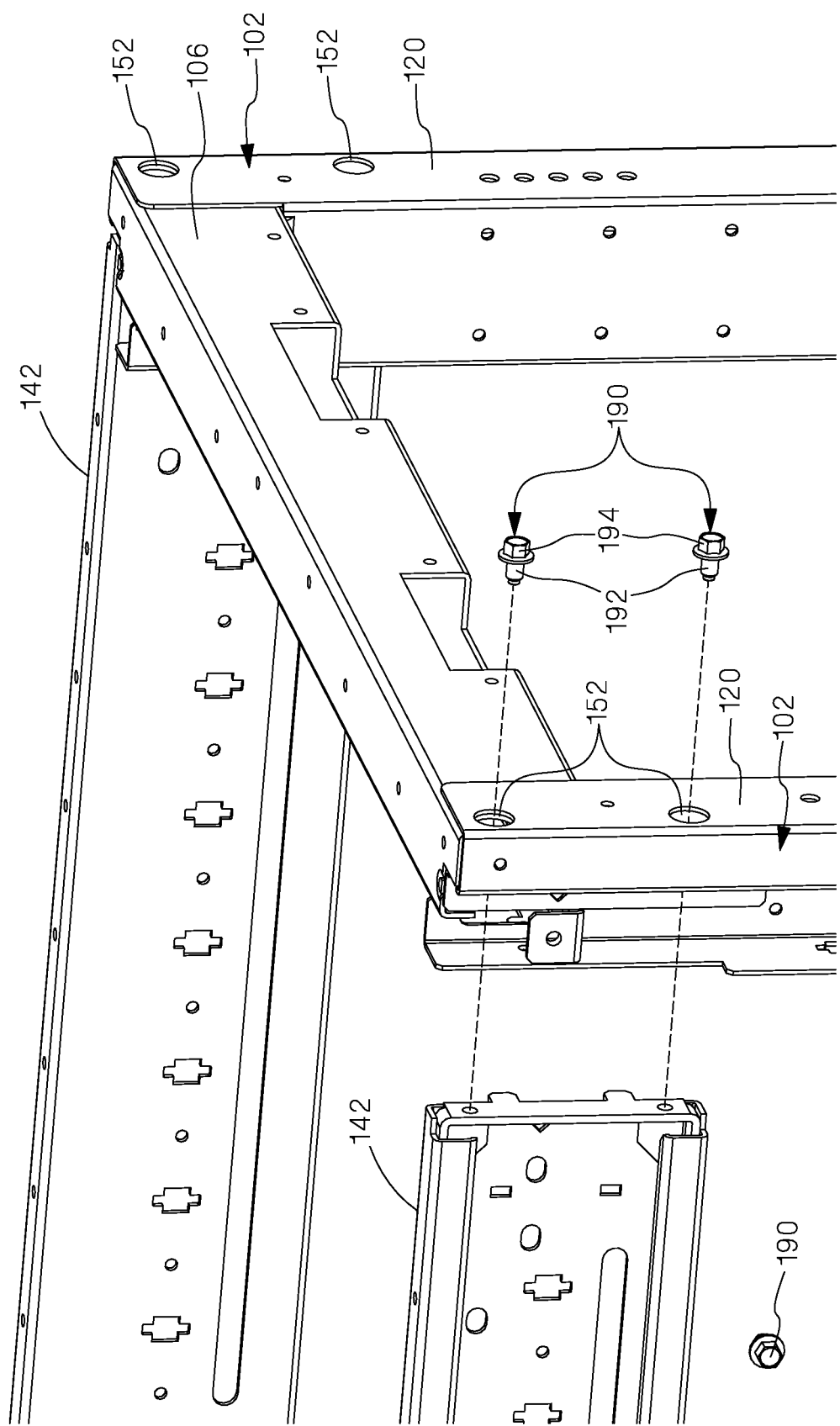
FIG. 3 is a partial, exploded, front-left perspective view of a portion of the base frame of FIG. 2.
Figure 4:
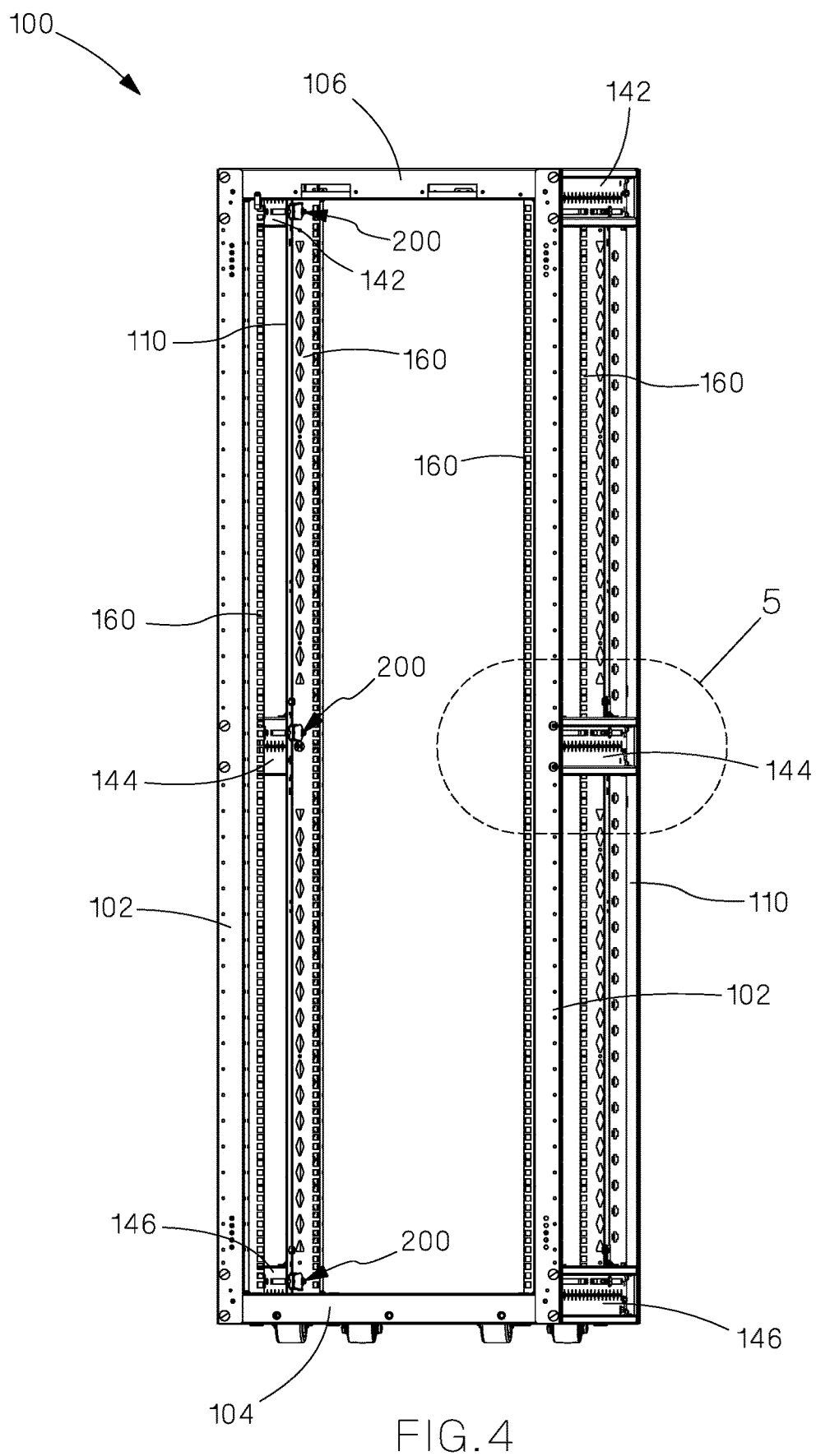
FIG. 4 is a front-right perspective view of the base frame of FIG. 2.

As best seen in FIGS. 2-3, base frame 100 includes a pair of front vertical posts 102, a bottom side-to-side beam 104, and top side-to-side beam 106, each positioned between and connected to each of the front vertical posts 102, for example by threaded members 190. The pair of front vertical posts 102, bottom side-to-side beam 104, and top side-to-side beam 106 together define a front picture frame assembly 108. Similarly, base frame 100 includes a pair of back vertical posts 110, a bottom side-to-side beam 112, and top side-to-side beam 114, each positioned between and connected to each of the back vertical posts 110, for example by threaded members 190. The pair of back vertical posts 110, bottom side-to-side beam 112, and top side-to-side beam 114 together define a back picture frame assembly 116.

Base frame 100 also has a first plurality of front-to-back beams 140 consisting of a top front-to-back beam 142, a middle front-to-back beam 144, and a bottom front-to-back beam 146 on a first side of base frame 100 and a second plurality of front-to-back beams 150 also consisting of a top front-to-back beam 142, a middle front-to-back beam 144, and a bottom front-to-back beam 146 on a second side of base frame 100, opposite the first side. The first plurality of front-to-back beams 140 are each positioned between and connected to one of the pair of front vertical posts 102 and one of the pair of back vertical posts 110 and the second plurality of front-to-back beams 150 are positioned between and connected to the other front vertical post 102 and the other back vertical post 110. The pair of top front-to-back beams 142, pair of middle front-to-back beams 144, and pair of bottom front-to-back beams 146 are connected and secured to respective front vertical posts 102 of front picture frame assembly 108 and back vertical posts 110 of back picture frame assembly 116 with threaded members 190 to interconnect front picture frame assembly 108 and back picture frame assembly 116.

Figure 5:
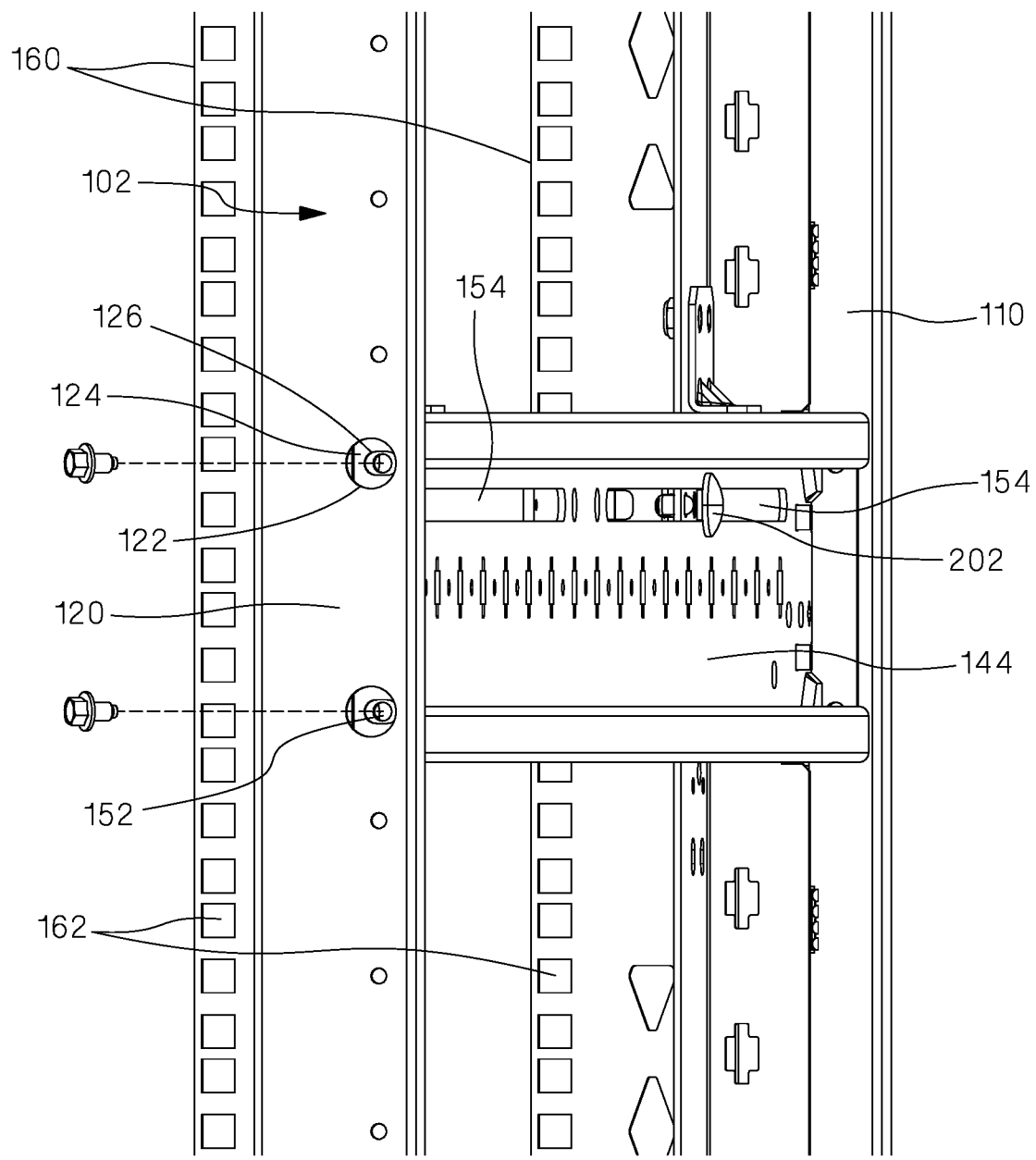
FIG. 5 is an enlarged partial view of a portion of the base frame of FIG. 4.
Figure 6:
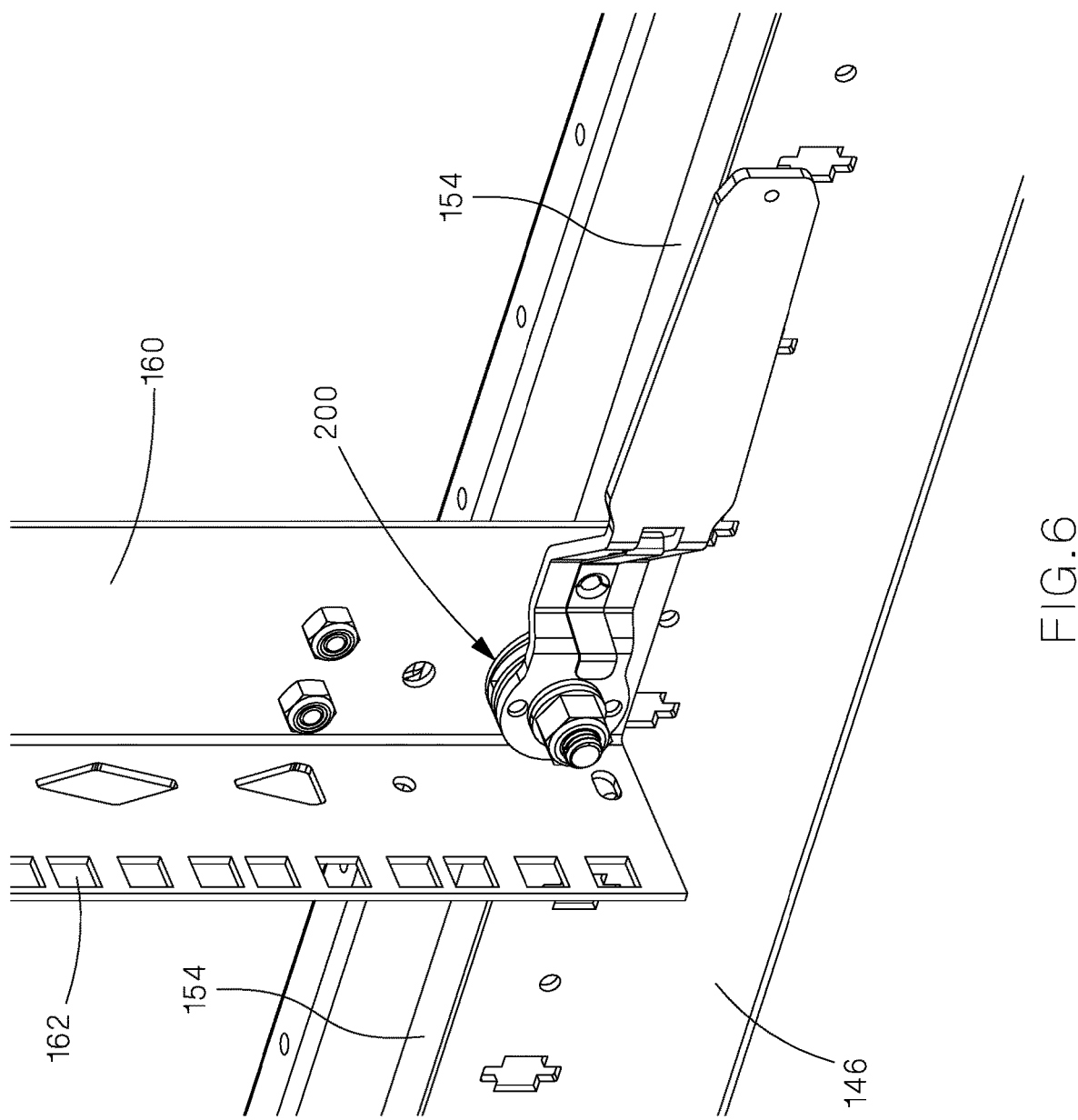
FIG. 6 is an enlarged partial view of a portion of the base frame of FIG. 2 showing a first example retaining mechanism between the equipment rail and a lower front-to-back beam.

While the top front-to-back beams 142 and bottom front-to-back beams 146 are secured to front vertical posts 102 and back vertical posts 110 in a relatively fixed position and the lateral position can be tightly controlled, middle front-to-back beams 144 are adjustable laterally. The lateral adjustability of middle front-to-back beams 144 can address possible issues that may arise from any potential bowing or curving of front vertical posts 102 or back vertical posts 110 and/or tolerance stack ups between assembled parts, which can leave middle front-to-back beams 144 either too close together or too far apart, and allows adjustment of middle front-to-back beams 144 to ensure that middle front-to-back beams 144 are installed such that EIA standards are adhered to once equipment rails 160 are installed. As best seen in one particular example front vertical post 102 and middle front-to-back beam 144 in FIGS. 4-5, each front vertical post 102 and back vertical post 110 have a laterally extending elongated slot 126 formed in a rear wall 124 of the respective front vertical post 102 or back vertical post 110 to receive the threaded post 192 of a threaded member 190 and an enlarged aperture 122 formed in a front wall 120 of the respective front vertical post 102 or back vertical post 110 and aligned with elongated slot 126. Rear wall 124 of each front vertical post 102 and back vertical post 110 is generally parallel to and spaced apart from front wall 120 and aperture 122 is configured to receive a head 194 of threaded member 190 therethrough. With threaded member 190 extending through slot 126 and through aperture 152 in an end of middle front-to-back beam 144, threaded member 190 and, therefore, middle front-to-back beam 144 can be adjusted laterally before threaded member 190 is fully tightened and middle front-to-back beam 144 is secured to the respective front vertical post 102 or back vertical post 110. The lateral adjustability of middle front-to-back beams 144 allows the distance between middle front-to-back beams 144 to be adjusted as required, as discussed in more detail below.

Adjustable equipment rails 160 are movably secured to top, middle, and bottom front-to-back beams 142, 144, 146 on opposite sides of base frame 100 and are configured to receive and retain electronic components within data center cabinet via cage nut holes 162 in equipment rails 160. Equipment rails 160 are connected to top, middle, and bottom front-to-back beams 142, 144, 146 with retaining mechanisms, such as retaining mechanism 200 or retaining mechanism 300, such that equipment rails 160 can be adjusted forward and backward within data center cabinet 10 as needed to allow the mounting of electronic components of different sizes. Each equipment rail 160 is secured to one top front-to-back beam 142, one middle front-to-back beam 144, and one bottom front-to-back beam 146 of either the first plurality of front-to-back beams 140 or the second plurality of front-to-back beams 150. In the example shown, there are four equipment rails 160 in base frame 100 and each equipment rail 160 is secured to a top, middle, and bottom front-to-back beam 142, 144, 146, therefore, there are twelve points of attachment and twelve retaining mechanisms 200.

Figure 7:
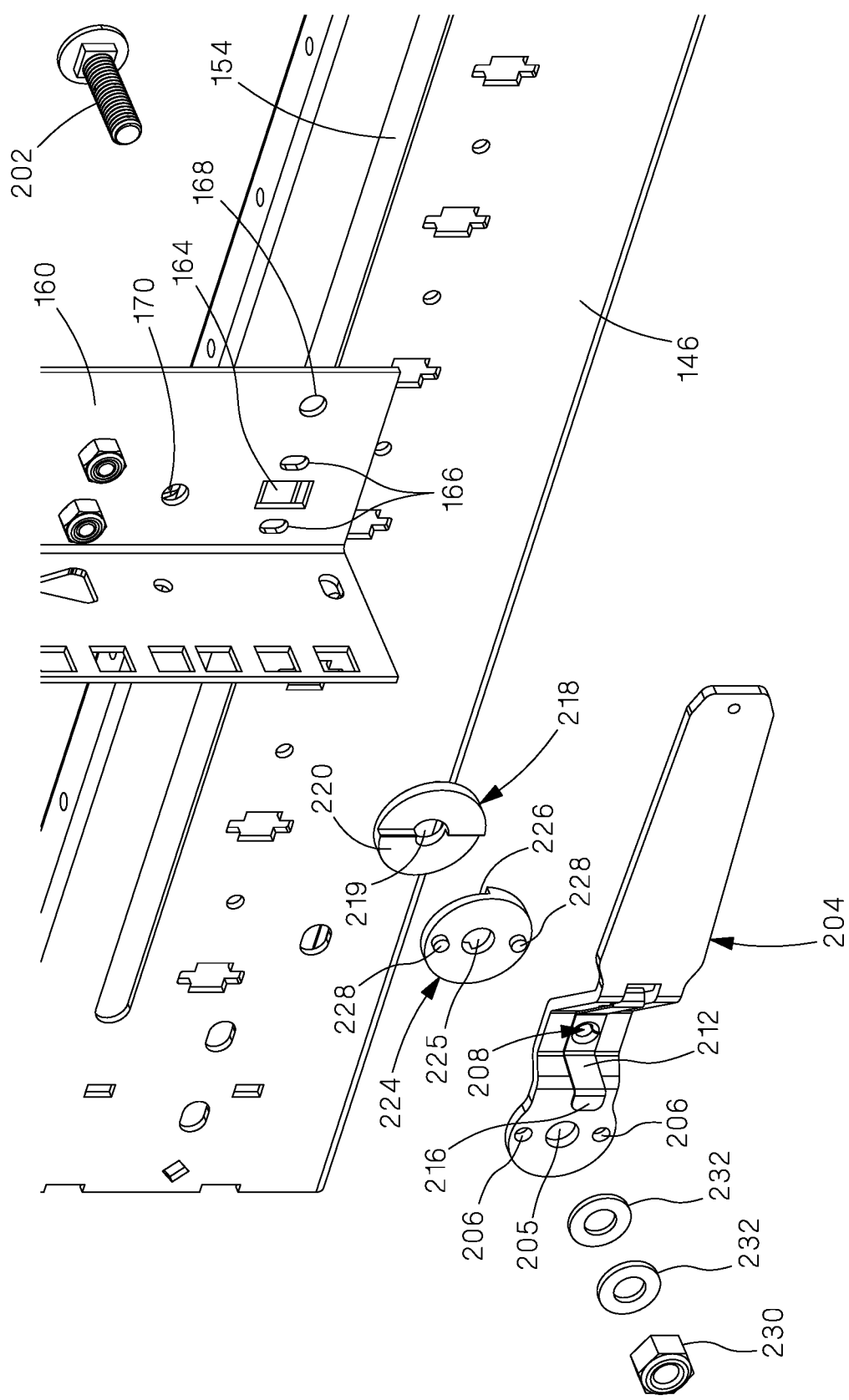
FIG. 7 is an exploded view of FIG. 6.
Figure 8:
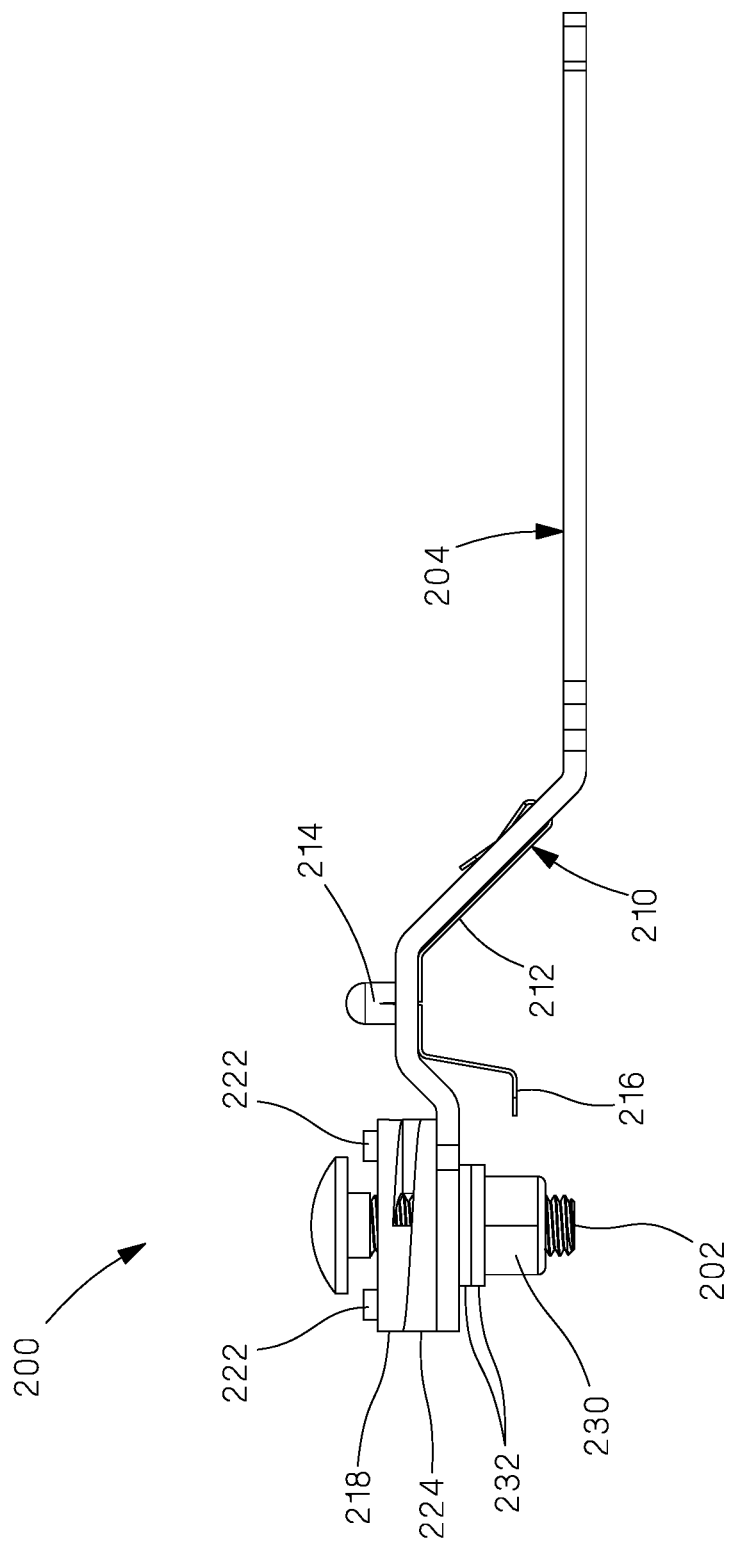
FIG. 8 is a top view of the first example retaining mechanism of FIG. 6.
Figure 11:
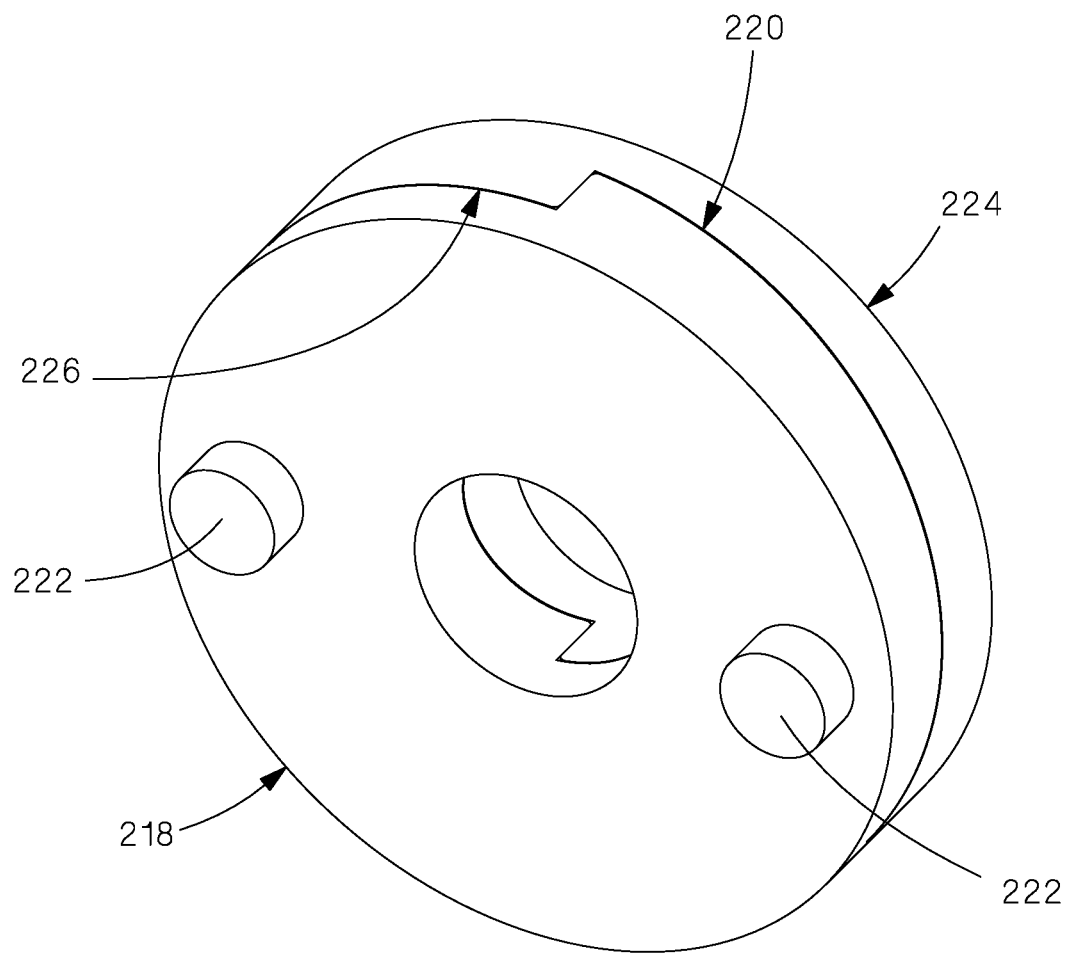
FIG. 11 is a rear perspective view of the first and second cam disks of the first example retaining mechanism of FIG. 9 with the cam surface disengaged.

Referring to FIGS. 6-11, a first example retaining mechanism 200 is illustrated that secures the bottom of one equipment rail 160 to a bottom front-to-back beam 146 on the right side of base frame 100. As noted above, the following detailed description of retaining mechanism 200 applies to all retaining mechanisms at all of the connection points between equipment rails 160 and the top, middle, and bottom front-to-back beams 142, 144, 146 on the left and right sides of base frame to allow equipment rails 160 to be easily moved forward and backward within base frame 100 and then secured in position without the use of any tools. As best seen in FIG. 7, the first example retaining mechanism 200 generally includes threaded member 202, first cam disk 218, second cam disk 224, handle 204, flat washers 232, and lock nut 230. These elements work together to generate tension in threaded member 202 and a clamping force between equipment rail 160 and bottom front-to-back beam 146 by rotating handle 204, as described in more detail below.

Threaded member 202 is inserted from an exterior of bottom front-to-back beam 146 and extends through longitudinal elongated slot 154 in front-to-back beam 146 and aperture 164 in equipment rail 160. Elongated slot 154 retains threaded member 202 while also allowing threaded member 202, and therefore retaining mechanism 200 and equipment rail 160 to be moved along bottom front-to-back beam 146 when handle 204 of retaining mechanism 200 is in a first or unlocked position.

First cam disk 218 is positioned on threaded member 202 between handle 204 and equipment rail 160 and proximate equipment rail 160 such that threaded member 202 extends through hole 219 in the center of first cam disk 218. First cam disk 218 has a first cam surface 220 on one planar side of first cam disk 218 that faces away from equipment rail 160 and protrusions 222 that extend from another planar side of first cam disk 218, opposite first cam surface 220. Protrusions 222 are received in apertures 166 in equipment rail 160 to fix first cam disk 218 to equipment rail 160 such that first cam disk 218 does not rotate relative to equipment rail 160.

Second cam disk 224 is positioned on threaded member 202 between handle 204 and first cam disk 218 such that threaded member 202 extends through hole 225 in the center of second cam disk 224. Second cam disk 224 has a second cam surface 226 on one planar side for second cam disk 224 that faces towards first cam surface 220 and away from handle 204 and protrusions 228 that extends from another planar side of second cam disk 224, opposite second cam surface 226. Protrusions 228 are received in apertures 206 in handle 204 to fix second cam disk 224 to handle 204 such that second cam disk 224 rotates with handle 204.

Handle 204 is also positioned on threaded member 202 such that threaded member 202 extends through hole 205 in handle 204 and handle 204 is rotatable relative to threaded member 202 between a first (locked or clamped) position where retaining mechanism 200 prevents movement of equipment rail 160 and a second (unlocked or unclamped) position in which retaining mechanism 200 allows movement of equipment rail 160. In the example shown, handle 204 also has a retainer assembly 210 that can retain handle 204 in place when handle 204 is in the first or second positions. Retainer assembly 210 includes a resilient spring clip 212 that is attached to handle 204 such that spring clip 212 is biased towards a locked position and is moveable from the locked position to an unlocked position. Spring clip 212 has a protruding retaining head 214 that extends through aperture 208 in handle 204 and is configured to engage first aperture 168 in equipment rail 160 to retain handle 204 in the first position and to engage second aperture 170 in equipment rail 160 to retain handle 204 in the second position in the locked position. A thumb flange 216 at an end of spring clip 212 is spaced apart from handle 204 and can be used to move spring clip 212 from the locked position to the unlocked position. Thumb flange 216 is configured such that lifting of thumb flange 216 moves retaining head 214 out of engagement with first or second apertures 168, 170 to allow rotation of handle 204.

Lock nut 230 is threaded onto the end of threaded member 202 to secure handle 204, first cam disk 218, and second cam disk 224 on threaded member 202. In addition, one or more flat washers 232 can also be positioned on threaded member 202 between handle 204 and lock nut 230 to prevent rotation of lock nut 230 with handle 204.

When handle 204 is rotated towards the first position, second cam surface 226 of second cam disk 224, which is fixed to handle 204, engages and slides against first cam surface 220 of first cam disk 218, which is fixed to equipment rail 160 and cannot rotate. As second cam surface 226 engages and slides against first cam surface 220, second cam disk 224 presses on first cam disk 218 resulting in tension in threaded member 202, which produces a clamping force between equipment rail 160 and bottom front-to-back beam 146 to lock equipment rail 160 in place. The magnitude of the tension and resulting clamping force can be adjusted by adjustment of the position of lock nut 230 along threaded member 202. To unlock retaining mechanism 200, spring clip 212 is lifted by thumb flange 216, which disengages retaining head 214 from first aperture 168 in equipment rail 160. Handle can then be rotated (counterclockwise in the example shown) into the second position. As handle 204 is rotated to the second position, first cam surface 220 slides down and disengages second cam surface 226 (FIG. 11), which moves first and second cam disks 218, 224 closer together and removes the clamping force between equipment rail 160 and bottom front-to-back beam 146, which allows movement of equipment rail 160 (when all retaining mechanisms 200 of a particular equipment rail 160 are all unlocked or disengaged). When handle 204 reaches the second position, retaining head 214 of spring clip 212 engages second aperture 170 in equipment rail 160 to retain handle 204 in the second position.

Figure 12:
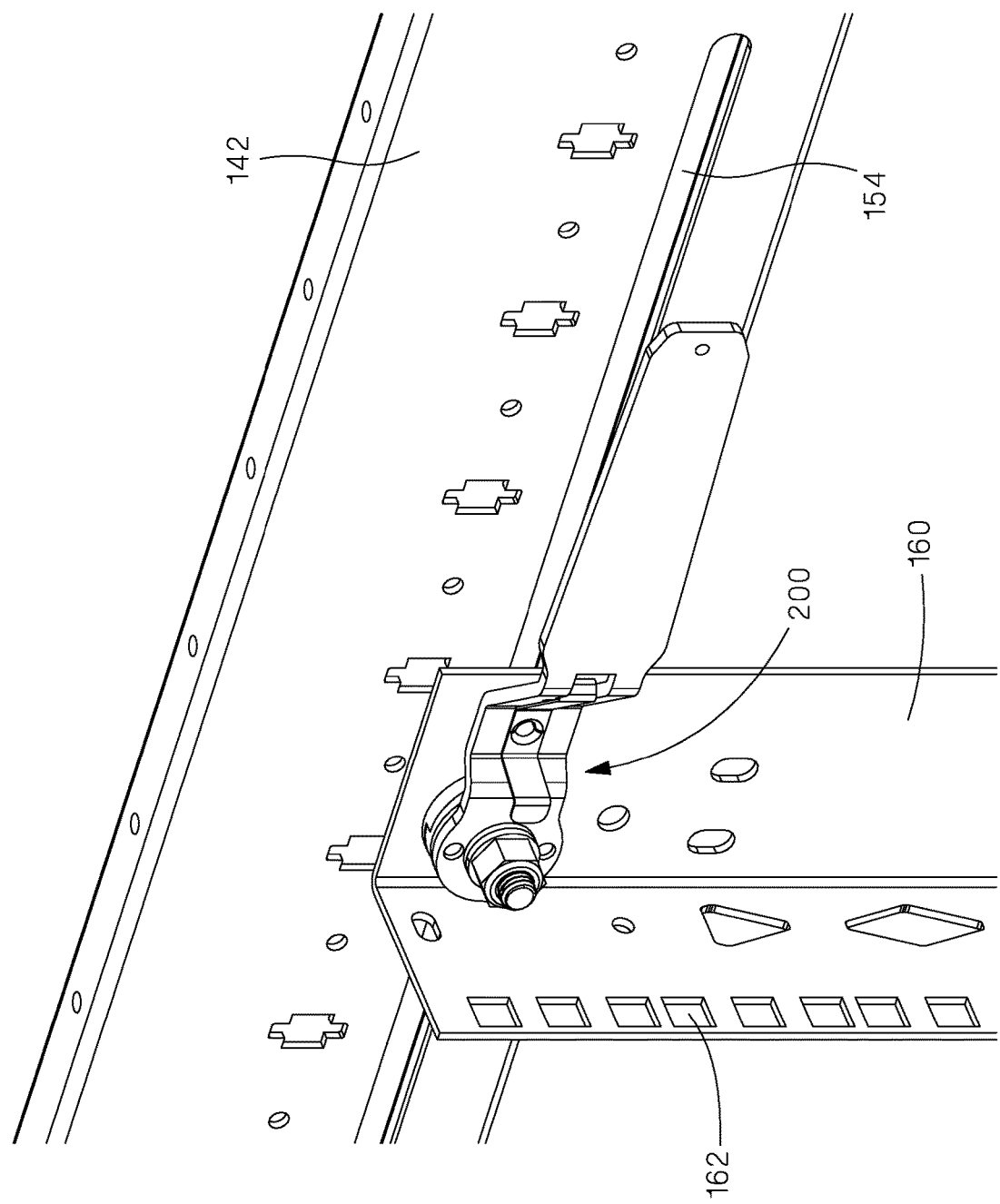
FIG. 12 is an enlarged partial view of another portion of the base frame of FIG. 2 showing the first example retaining mechanism between the equipment rail and an upper front-to-back beam.
Figure 13:
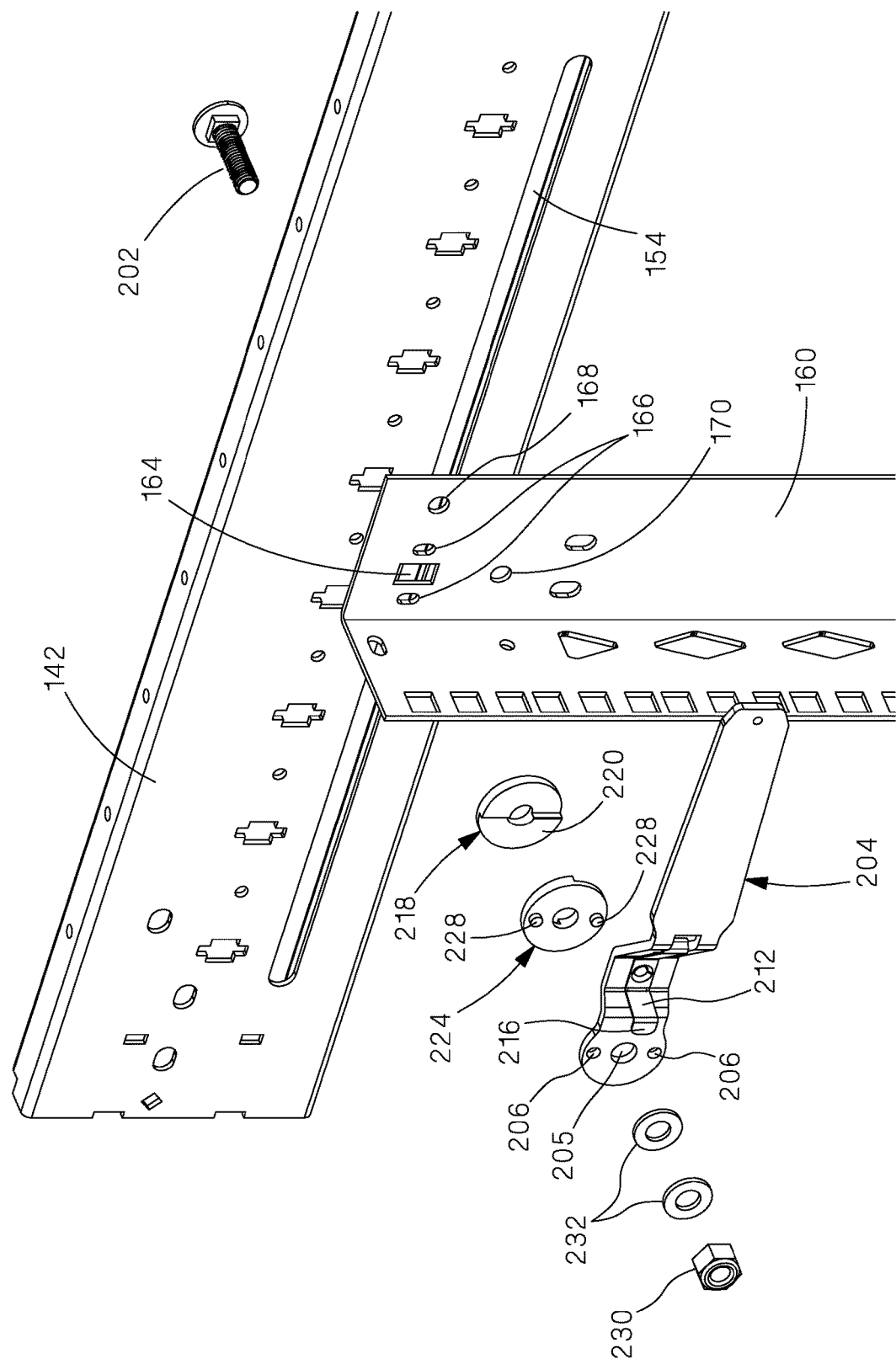
FIG. 13 is an exploded view of FIG. 12.
Figure 14A:
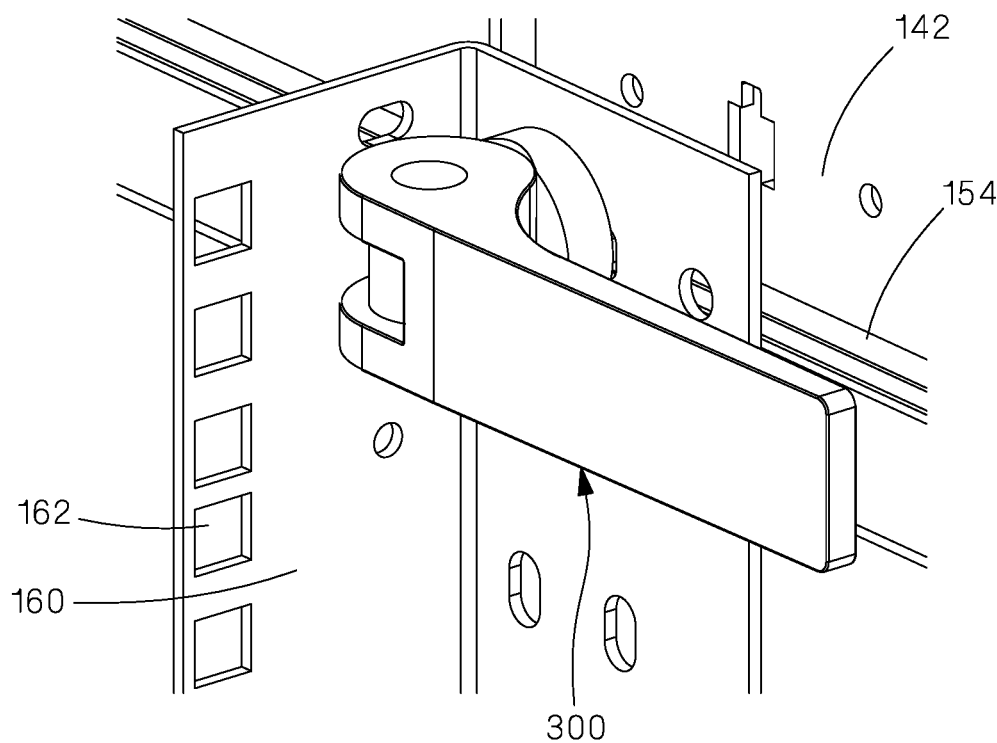
FIG. 14A is an enlarged partial view of a portion of the base frame of FIG. 2 showing a second example retaining mechanism between the equipment rail and an upper front-to-back beam.
Figure 14B:
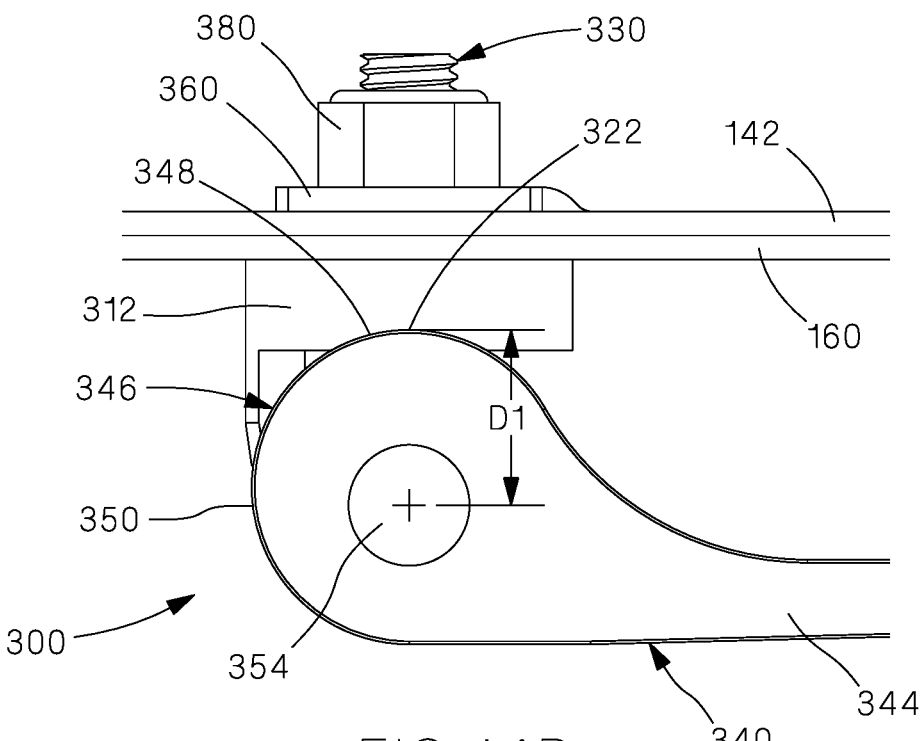
FIG. 14B is a top view of FIG. 14A.

As shown in FIGS. 6-11, first and second cam disks 218, 224 are both left hand cams with first and second cam surfaces 220, 226 that slope in a clockwise direction. This configuration allows handle 204 to be vertical (parallel to equipment rail 160) in the second or unlocked position and rotated clockwise to be horizontal (parallel to bottom front-to-back beam 146) in the first or locked position. However, this configuration will not work for all locations of the retaining mechanisms 200 and still allow handle to be horizontal in the first or locked position. For example, at the top of equipment rail 160, handle 204 would be prevented from rotating counter-clockwise from the horizontal position by top cap 30. Therefore, as shown in FIGS. 12-13, retaining mechanism 200 can also have first and second cam disks 218, 224 that are right hand cams with first and second cam surfaces 220, 226 that slope in a counter-clockwise direction. This configuration allows handle 204 to be vertical (parallel to equipment rail 160) in the second or unlocked position and rotated counter-clockwise to be horizontal (parallel to bottom front-to-back beam 146) in the first or locked position.

Figure 15A:
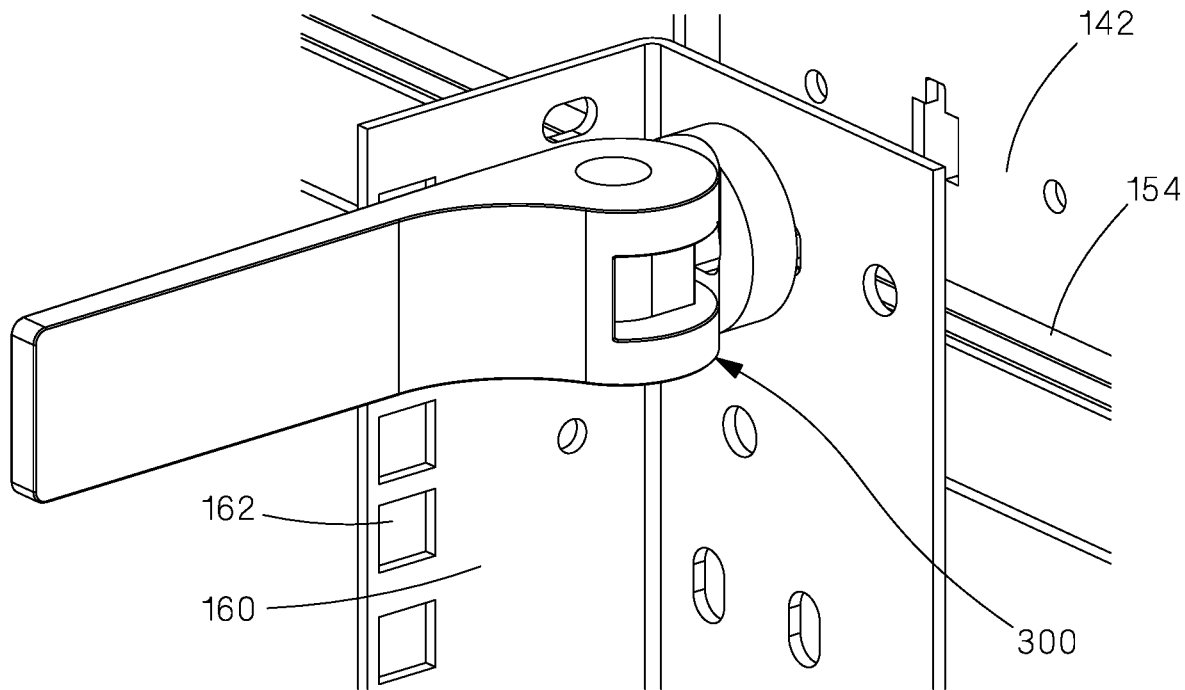
FIG. 15A is the partial view of FIG. 14A with the second example retaining mechanism in an unclamped position.
Figure 15B:
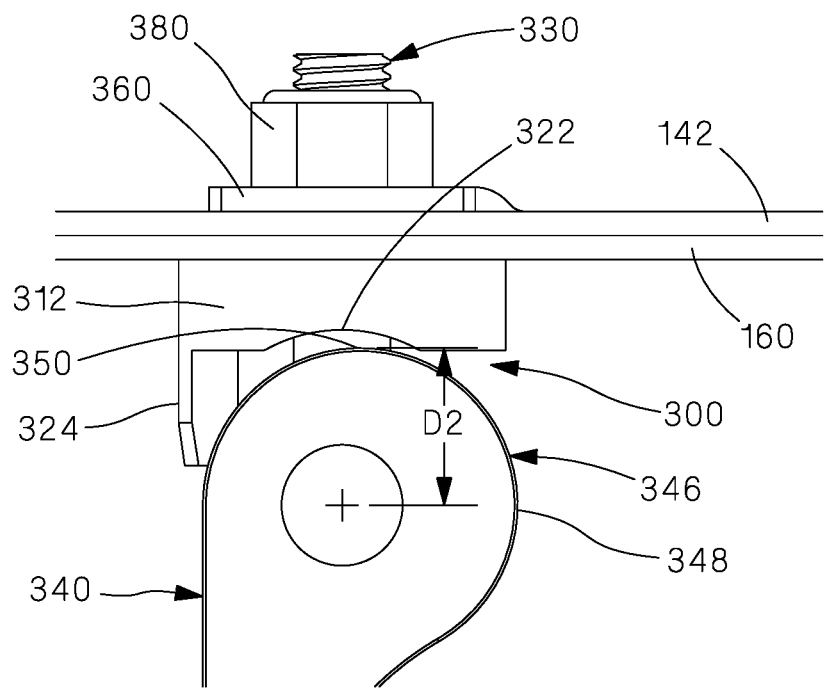
FIG. 15B is a top view of FIG. 15A.
Figure 16:
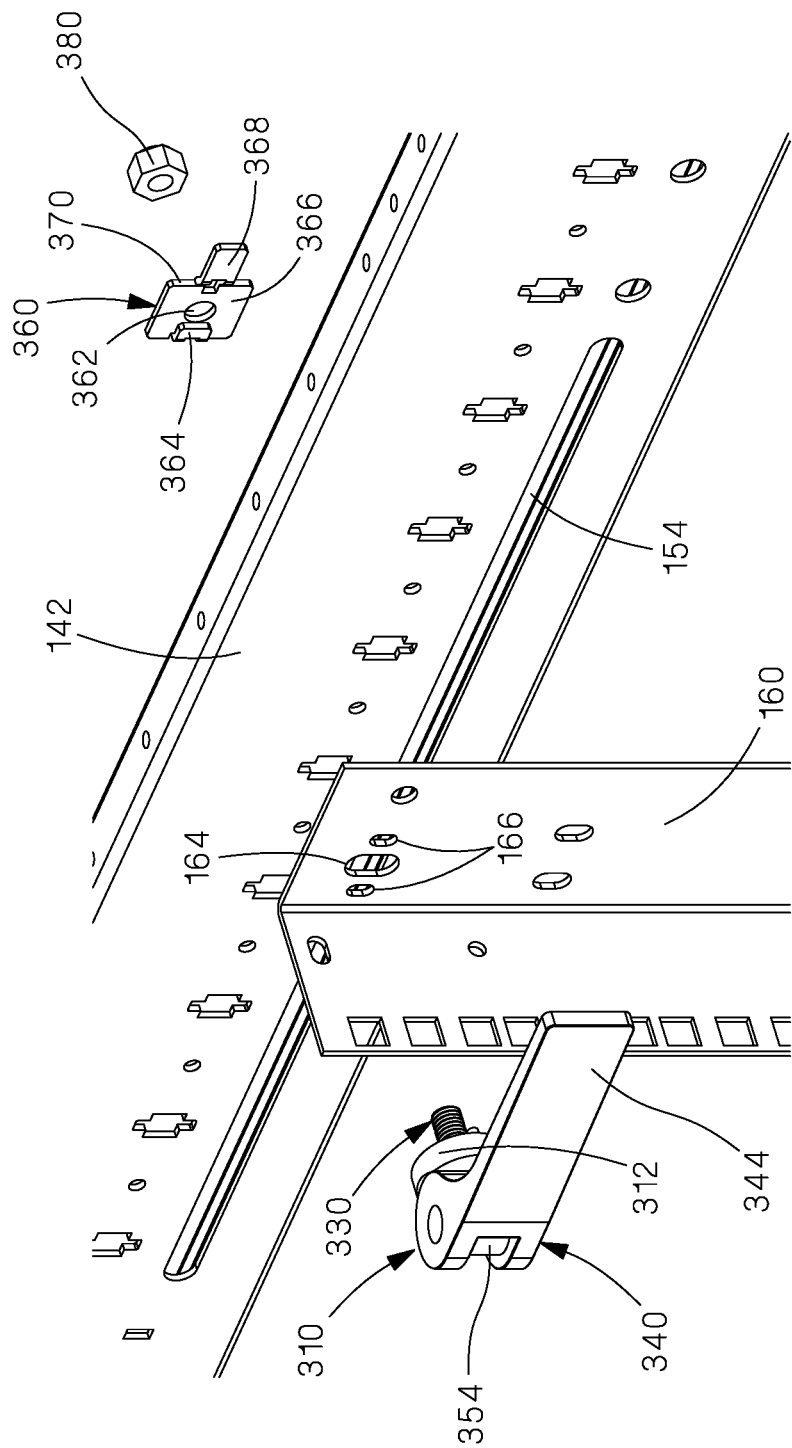
FIG. 16 is an exploded view of FIG. 14A.

Referring to FIGS. 14A-18, a second example retaining mechanism 300 is illustrated that is shown securing the top of one equipment rail 160 to a top front-to-back beam 142 on the right side of base frame 100. As above, the following detailed description of retaining mechanism 300 applies to all retaining mechanisms at all of the connection points between equipment rails 160 and the top, middle, and bottom front-to-back beams 142, 144, 146 on the left and right sides of base frame to allow equipment rails 160 to be easily moved forward and backward within base frame 100 and then secured in position without the use of any tools. As best seen in FIG. 16, second example retaining mechanism 300 generally includes a cam lever assembly 310, a slider 360, and a lock nut 380. These elements work together to generate tension in a threaded member 330 of cam lever assembly 310 and a clamping force between equipment rail 160 and top front-to-back beam 142 in a clamped position (FIGS. 14A-B), as described in more detail below, and to remove the clamping force in an unclamped position (FIGS. 15A-B) to allow movement of equipment rail 160 relative to top front-to-back beam 142.

Figure 17:
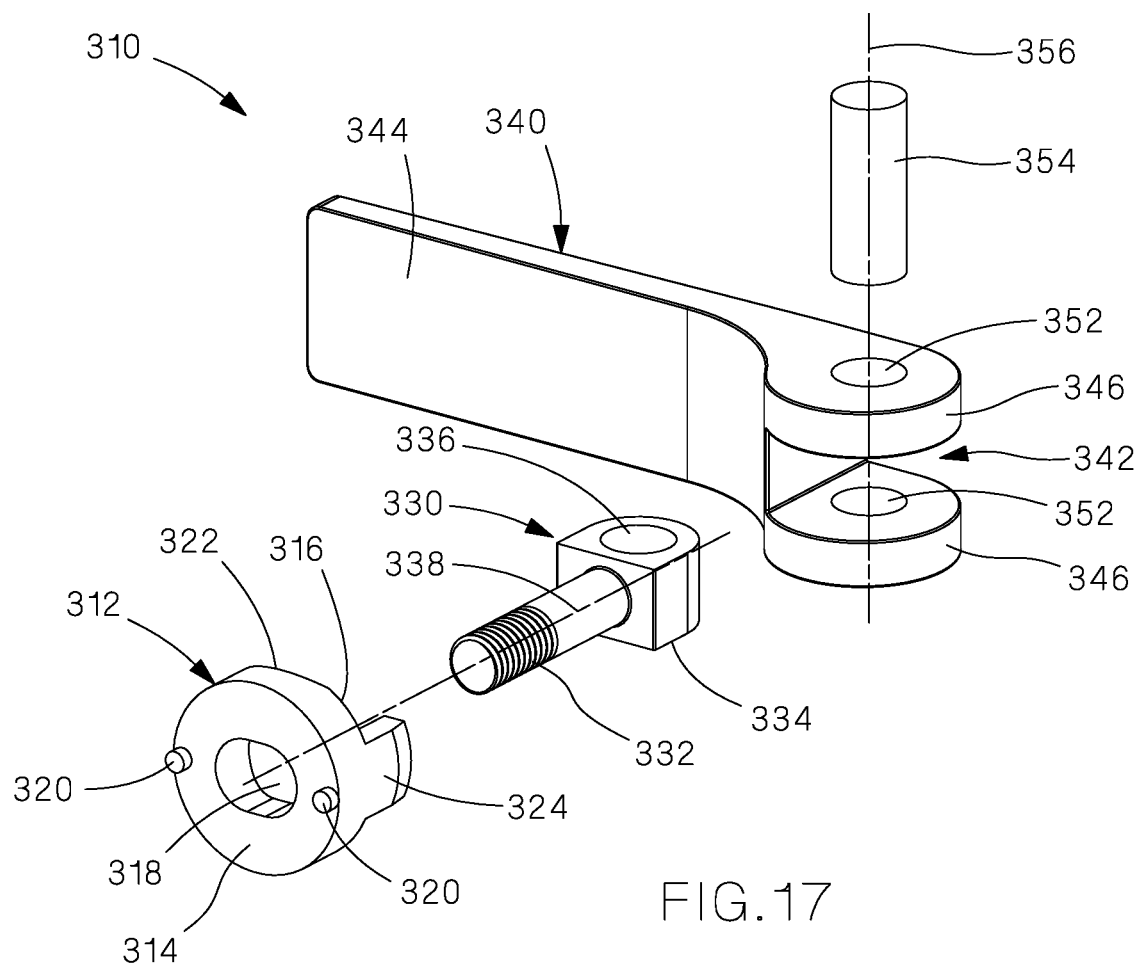
FIG. 17 is an exploded view of the cam lever assembly of the second example retaining assembly.
Figure 18:
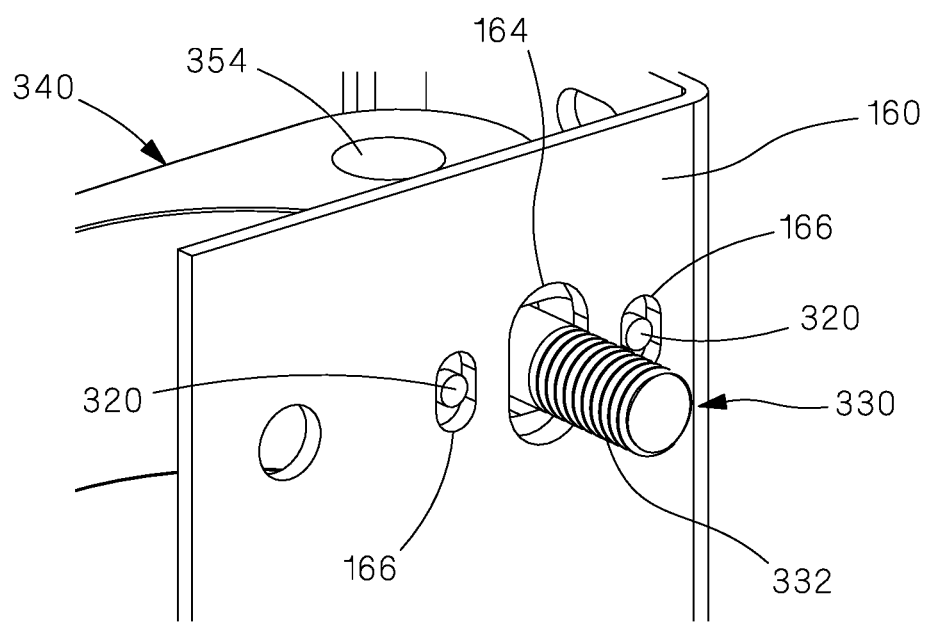
FIG. 18 is a perspective view of the cam lever assembly of the second example retaining assembly engaging an equipment rail.

As can best be seen in FIG. 17, cam lever assembly 310 generally includes a bushing 312, a threaded member 330, and a handle 340 that is attached to and rotatable relative to threaded member 330. In the example shown, bushing 312 is generally cylindrical and has an inner surface 314, and outer surface 316, and an aperture 318 that is formed through bushing 312 between inner surface 314 and outer surface 316. Inner surface 314 of bushing 312 engages equipment rail 160 and a plurality of protrusions 320, or pins, extend from inner surface 314 and, as seen in FIGS. 16 and 18, are received in apertures 166 in equipment rail 160 to prevent movement and rotation of bushing 312 relative to equipment rail 160 and prevent handle 340 from spinning. Although a pair of protrusions 320 are shown, any number of protrusions 320 could be used. Outer surface 316 of bushing 312 has a concave arcuate surface 322 that is configured to engage a convex arcuate cam surface 346 of handle 340 with the handle 340 in the clamped position, as discussed in more detail below. In addition, a projection 324, tab, or guide extends from outer surface 316 and is positioned in a slot 342 in handle 340.

Threaded member 330, such as an eye bolt, includes a shaft 332 that is generally cylindrical and threaded along at least a portion of shaft 332 and a head 334 attached to shaft 332. Shaft 332 of threaded member 330 extends through aperture 318 in bushing 312, through aperture 164 in equipment rail 160, and through elongated slot 154 in top front-to-back beam 142. Aperture 164 retains threaded member 330 in equipment rail 160 and elongated slot 154 retains threaded member 330 in top front-to-back beam 142 while also allowing threaded member 330, and therefore retaining mechanism 300 and equipment rail 160 to be moved along top front-to-back beam 142 when handle 340 of retaining mechanism 300 is in the unclamped position (FIGS. 15A-B).

Handle 340 has a tab 344 or lever that can be engaged by a user to move handle 340 between the clamped and unclamped positions. Slot 342 in handle 340 is configured to receive head 334 of threaded member 330 and a pin 354 is inserted and extends through apertures 352 in handle 340 and through an aperture 336 in head 334 of threaded member 330 to secure and rotatably attach handle 340 to threaded member 330 and allow handle 340 to rotate relative to threaded member 330 about a longitudinal axis 356 of pin 354. Projection 324 of bushing 312 is also positioned in slot 342 to prevent rotation of handle 340 about a longitudinal axis 338 of threaded member 330 and keep handle 340 in a horizontal position in the clamped and unclamped positions.

Slider 360 has an aperture 362 to receive threaded member 330 and is positioned on threaded member 330 on an opposite side of top front-to-back beam 142 from cam lever assembly 310 and lock nut 380 is threaded on threaded member 330, adjacent slider 360, to secure cam lever assembly 310 and slider 360 to equipment rail 160. As best seen in FIG. 16, in the particular example shown, slider 360 also has a first protrusion 364 that extends from an inner surface 366 of slider 360 and is configured to be received in and slide within elongated slot 154 in top front-to-back beam 142. A second protrusion 368 also extends from inner surface 366 and from a lateral edge 370 of slider 360 and is configured to be received in and slide within elongated slot 154 in top front-to-back beam 142. Slider 360 acts as a washer under lock nut 380 and makes repositioning of equipment rail 160 smoother and better controlled.

As discussed above, handle 340 is rotatable between a clamped position (FIGS. 14A-B) and an unclamped position (FIGS. 15A-B). In the clamped position, a clamping force is exerted between equipment rail 160 and top front-to-back beam 142 to prevent movement of equipment rail 160. In the clamped position, tab 344 of handle 340 is positioned parallel to top front-to-back beam 142 and a first section 348 of arcuate cam surface 346 engages arcuate surface 322 of bushing 312 to provide the clamping force. To provide this clamping force, a first radial distance D1 from the longitudinal axis 356 of pin 354 to first section 348 of arcuate cam surface 346 is greater than the radial distance from the longitudinal axis 356 of pin 354 to arcuate surface 322 of bushing 312. This forces bushing 312 towards slider 360 and lock nut 380, or pulls slider 360 and lock nut 380 towards bushing 312, which clamps equipment rail 160 and top front-to-back beam 142 together and prevents movement of equipment rail 16. The magnitude of the clamping force can be adjusted through the amount of torque applied on lock nut 380. Conversely, in the unclamped position, tab 344 of handle 340 is positioned perpendicular to top front-to-back beam 142 and the clamping force between equipment rail 160 and top front-to-back beam 142 is removed to allow movement of equipment rail 160. In the unclamped position, a second section 350 of arcuate cam surface 346 is spaced apart from and does not engage arcuate surface 322 of bushing 312 so that the clamping force is not provided. To remove the clamping force, a second radial distance D2 from the longitudinal axis 356 of pin 354 to second section 350 of arcuate cam surface 346 is less than the radial distance from the longitudinal axis 356 of pin 354 to arcuate surface 322 of bushing 312. This allows bushing 312 to move away from slider 360 and lock nut 380, which removes the clamping force and allows movement of equipment rail 16.

To assemble base frame 100 of data center cabinet 10, first top and bottom side-to-side beams 106, 104 are secured between front vertical posts 102 with threaded members 190 to form front picture frame assembly 108 and second top and bottom side-to-side beams 114, 112 are secured between back vertical posts 110 with threaded members 190 to form back picture frame assembly 116. Top front-to-back beams 142 and bottom front-to-back beams 146 are then secured between front picture frame assembly 108 and back picture frame assembly 116 with threaded members 190. With top and bottom front-to-back beams 142, 146 secured, middle front-to-back beams 144 are aligned between front and back picture frame assemblies 108, 116 by inserting threaded members 190 through slots 126 in front and back vertical posts 102, 110 and into apertures 152 in middle front-to-back beam 144. A pair of equipment rails 160 are then secured to top, middle, and bottom front-to-back beams 142, 144, 146, preferably with retaining mechanisms 200 or retaining mechanisms 300 discussed above, such that one equipment rail 160 is secured to first plurality of front-to-back beams 140 on one side of base frame 100 and the other equipment rail 160 is secured to second plurality of front-to-back beams 150 on another side of base frame 100, opposite the first equipment rail 160. The lateral distance between the pair of equipment rails 160 is then adjusted, for example, by sliding threaded members 190 within slots 126 to move equipment rails 160 closer together or further apart. To determine the correct lateral distance, equipment rails 160 can be aligned by inserting a gauge between equipment rails 160 such that the lateral distance between the equipment rails 160 is a predetermined distance (i.e., within EIA requirements) or such that the lateral distance between centers of opposing cage nut holes 162 in equipment rails 160 is a predetermined distance (i.e., within EIA requirements). Once equipment rails 160 have been aligned and the lateral distance between equipment rails 160 adjusted as required, middle front-to-back beams 144 are then secured to front and back picture frame assemblies 108, 116 by tightening threaded members 190.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A data center cabinet, comprising:
    a first plurality of front-to-back beams and a second plurality of front-to-back beams; and
    an equipment rail movably secured to each of the first plurality of front-to-back beams by a retaining mechanism, the retaining mechanism comprising:
    a threaded member extending through an elongated slot in one of the first plurality of front-to-back beams and an aperture in the equipment rail;
    a handle positioned on the threaded member, the handle rotatable relative to the threaded member;
    a first cam disk having a first cam surface, the first cam disk positioned on the threaded member between the handle and the equipment rail and fixed to the equipment rail;
    a second cam disk having a second cam surface, the second cam disk positioned on the threaded member between the handle and the first cam disk and fixed to the handle such that the second cam disk is rotatable with the handle; and
    a lock nut threaded on the threaded member to secured the handle, the first cam disk, and the second cam disk on the threaded member; wherein
    the handle is rotatable between a first position and a second position;
    the first cam surface and the second cam surface are engaged in the first position to provide a clamping force between the equipment rail and the one of the first plurality of front-to-back beams to prevent movement of the equipment rail; and
    the first cam surface and the second cam surface are disengaged in the second position to remove the clamping force to allow movement of the equipment rail.

2. The data center cabinet of claim 1, comprising a pair of front vertical posts, a first bottom side-to-side beam and a first top side-to-side beam positioned between and connected to the pair of front vertical posts, a pair of back vertical posts, and a second bottom side-to-side beam and a second top side-to-side beam positioned between and connected to the pair of back vertical posts; wherein the first plurality of front-to-back beams are positioned between and connected to one of the pair of front vertical posts and one of the pair of back vertical posts and the second plurality of front-to-back beams are positioned between and connected to the other one of the pair of front vertical posts and the other one of the pair of back vertical posts.

3. The data center cabinet of claim 2, wherein the pair of front vertical posts, the first bottom side-to-side beam, and the first top side-to-side beam define a front picture frame assembly; the pair of back vertical posts, the second bottom side-to-side beam, and the second top side-to-side beam define a back picture frame assembly; and the first and second plurality of front-to-back beams are connected to the front and back vertical posts with threaded members to interconnect the front picture frame assembly and the back picture frame assembly.

4. The data center cabinet of claim 1, wherein the first cam disk is fixed to the equipment rail by a plurality of protrusions extending from the first cam disk, opposite the first cam surface, that are received in a plurality of apertures in the equipment rail.

5. The data center cabinet of claim 1, wherein the handle is fixed to the second cam disk by a plurality of protrusions extending from the second cam disk, opposite the second cam surface, that are received in a plurality of apertures in the handle.

6. The data center cabinet of claim 1, wherein the handle comprises a retainer assembly to retain the handle when the handle is in the first position and when the handle is in the second position.

7. The data center cabinet of claim 6, wherein the retainer assembly comprises a spring clip attached to the handle, the spring clip having a protruding retaining head configured to engage a first aperture in the equipment rail to retain the handle in the first position and to engage a second aperture in the equipment rail to retain the handle in the second position.

8. The data center of claim 7, wherein the protruding retaining head extends through an aperture in the handle.

9. The data center cabinet of claim 7, wherein the spring clip includes a thumb flange configured to allow movement of the protruding retaining head out of engagement with the first aperture or the second aperture to allow rotation of the handle.

10. The data center cabinet of claim 1, comprising a flat washer positioned on the threaded member between the handle and the lock nut to prevent rotation of the lock nut with the handle.

11. A data center cabinet, comprising:
a front picture frame assembly including a pair of front vertical posts, a first top side-to-side beam secured to the pair of front vertical posts, and a first bottom side-to-side beam secured to the pair of front vertical posts;
a back picture frame assembly including a pair of back vertical posts, a second top side-to-side beam secured to the pair of back vertical posts, and a second bottom side-to-side beam secured to the pair of back vertical posts;
a pair of top front-to-back beams secured to the front picture frame assembly and the back picture frame assembly;
a pair of bottom front-to-back beams secured to the front picture frame assembly and the back picture frame assembly;
a pair of middle front-to-back beams secured to the front picture frame assembly and the back picture frame assembly, the pair of middle front-to-back beams being adjustable laterally such that a distance between the pair of middle front-to-back beams can be adjusted;
wherein the pair of front vertical posts and the pair of back vertical posts each have an elongated slot that extends laterally across each front vertical posts and back vertical post and the middle front-to-back beams are secured to the front picture frame assembly and the back picture frame assembly by threaded members that extend through the elongated slots in the front vertical posts and the back vertical posts and through apertures in each of the middle front-to-back beams; and
wherein each of the front vertical posts and the back vertical posts comprises a front wall and a rear wall generally parallel and spaced apart from the front wall, the elongated slot is formed in the rear wall, and an enlarged aperture is formed in the front wall, is configured to receive a head of the threaded member, and is aligned with the elongated slot.

12. The data center cabinet of claim 11, comprising an equipment rail secured to one of each of the pairs of the top, middle, and bottom front-to-back beams by a retaining mechanism, the retaining mechanism comprising:
a threaded member extending through an elongated slot in one of the one of the pairs of the top, middle, and bottom front-to-back beams and an aperture in the equipment rail;
a handle positioned on the threaded member, the handle rotatable relative to the threaded member;
a first cam disk having a first cam surface, the first cam disk positioned on the threaded member between the handle and the equipment rail and fixed to the equipment rail;
a second cam disk having a second cam surface, the second cam disk positioned on the threaded member between the handle and the first cam disk and fixed to the handle such that the second cam disk is rotatable with the handle; and
a lock nut threaded on the threaded member to secured the handle, the first cam disk, and the second cam disk on the threaded member; wherein
the handle is rotatable between a first position and a second position;
the first cam surface and the second cam surface are engaged in the first position to provide a clamping force between the equipment rail and the one of the one of the pairs of the top, middle, and bottom front-to-back beams to prevent movement of the equipment rail; and
the first cam surface and the second cam surface are disengaged in the second position to remove the clamping force to allow movement of the equipment rail.

13. The data center cabinet of claim 12, wherein the handle comprises a retainer assembly to retain the handle when the handle is in the first position and when the handle is in the second position, the retainer assembly comprising a spring clip attached to the handle, the spring clip having a protruding retaining head configured to engage a first aperture in the equipment rail to retain the handle in the first position and to engage a second aperture in the equipment rail to retain the handle in the second position.

14. A data center cabinet, comprising:
a front-to-back beam; and
an equipment rail positioned adjacent and movably secured to the front-to-back beam by a retaining mechanism, the retaining mechanism comprising:
a cam lever assembly including a bushing, a threaded member extending through an aperture in the bushing and through an elongated slot in the front-to-back beam, and a handle attached to the threaded member such that the handle is rotatable relative to the threaded member, the bushing including a plurality of protrusions extending from an inner surface of the bushing and received in a plurality of apertures in the equipment rail to prevent movement of the bushing relative to the equipment rail;
a slider positioned on the threaded member on an opposite side of the front-to-back beam from the cam lever assembly; and a lock nut threaded on the threaded member adjacent the slider; wherein the handle is rotatable between a clamped position, in which a clamping force is exerted between the equipment rail and the front-to-back beam to prevent movement of the equipment rail, and an unclamped position, in which the clamping force is removed to allow movement of the equipment rail.

15. The data center cabinet of claim 14, comprising a pair of front vertical posts, a first bottom side-to-side beam and a first top side-to-side beam positioned between and connected to the pair of front vertical posts, a pair of back vertical posts, and a second bottom side-to-side beam and a second top side-to-side beam positioned between and connected to the pair of back vertical posts; wherein the front-to-back beam is positioned between and connected to one of the pair of front vertical posts and one of the pair of back vertical posts.

16. The data center cabinet of claim 15, wherein the pair of front vertical posts, the first bottom side-to-side beam, and the first top side-to-side beam define a front picture frame assembly; the pair of back vertical posts, the second bottom side-to-side beam, and the second top side-to-side beam define a back picture frame assembly; and the front-to-back beam is connected to the front and back vertical posts with threaded members to interconnect the front picture frame assembly and the back picture frame assembly.

17. The data center cabinet of claim 14, wherein the handle includes a slot to receive a head of the threaded member and the cam lever assembly includes a pin that extends through apertures in the handle and an aperture in the head of the threaded member to rotatably attach the handle to the threaded member.

18. The data center cabinet of claim 17, wherein the bushing includes a projection that extends from an outer surface of the bushing and is positioned in the slot in the handle, the projection preventing rotation of the handle about a longitudinal axis of the threaded member.

19. The data center cabinet of claim 14, wherein the bushing has arcuate surface formed on an outer surface of the bushing that engages an arcuate cam surface of the handle with the handle in the clamped position.

20. The data center cabinet of claim 19, wherein the arcuate cam surface of the handle has a first section that engages the arcuate surface of the bushing with the handle in the clamped position to provide the clamping force and a second section that does not engage the arcuate surface of bushing with the handle in the unclamped position and does not provide the clamping force.

21. The data center cabinet of claim 14, wherein the slider has an aperture to receive the threaded member and a first protrusion extending from an inner surface of the slider, the first protrusion configured to be received and slide within the elongated slot in the front-to-back beam.

22. The data center cabinet of claim 21, wherein the slider has a second protrusion extending from the inner surface of the slider, the second protrusion configured to be received and slide within the elongated slot in the front-to-back beam.

23. The data center cabinet of claim 22, wherein the second protrusion extends from a lateral edge of the slider.

* * * * *